United States Patent
Weidner et al.

(10) Patent No.: US 8,847,247 B2
(45) Date of Patent: Sep. 30, 2014

(54) OPTOELECTRONIC MODULE COMPRISING AT LEAST ONE FIRST SEMICONDUCTOR BODY HAVING A RADIATION OUTLET SIDE AND AN INSULATION LAYER AND METHOD FOR THE PRODUCTION THEREOF

(75) Inventors: Karl Weidner, München (DE); Ralph Wirth, Lappersdorf (DE); Axel Kaltenbacher, Mintraching (DE); Walter Wegleiter, Nittendorf (DE); Bernd Barchmann, Regensburg (DE); Oliver Wutz, Regensburg (DE); Jan Marfeld, Regensburg (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 13/394,097

(22) PCT Filed: Aug. 6, 2010

(86) PCT No.: PCT/DE2010/000944
§ 371 (c)(1),
(2), (4) Date: May 21, 2012

(87) PCT Pub. No.: WO2011/026456
PCT Pub. Date: Mar. 10, 2011

(65) Prior Publication Data
US 2012/0235176 A1    Sep. 20, 2012

(30) Foreign Application Priority Data

Sep. 3, 2009  (DE) .......................... 10 2009 039 891

(51) Int. Cl.
*H01L 29/18*  (2006.01)
*H01L 33/44*  (2010.01)
*H01L 23/00*  (2006.01)
*H01L 33/62*  (2010.01)
*H01L 25/075*  (2006.01)
*H01L 33/50*  (2010.01)

(52) U.S. Cl.
CPC ................ *H01L 33/44* (2013.01); *H01L 33/62* (2013.01); *H01L 25/0753* (2013.01); *H01L 24/24* (2013.01); *H01L 33/50* (2013.01); *H01L 2224/73267* (2013.01)
USPC .................................... 257/88; 257/E33.059

(58) Field of Classification Search
CPC .................. H01L 2924/0002; H01L 2924/00; H01L 2224/48091; H01L 33/62; H01L 2924/00014
USPC ............... 257/88, E33.059, E27.12
See application file for complete search history.

(56) References Cited

U.S. PATENT DOCUMENTS 7,179,670 B2     2/2007  Shelton et al.
7,755,095 B2 *   7/2010  Nagai ........................... 257/88

(Continued)

FOREIGN PATENT DOCUMENTS

CN        1910761       2/2007
CN      101253623       8/2008

(Continued)

*Primary Examiner* — Tony Tran
(74) *Attorney, Agent, or Firm* — Cozen O'Connor

(57) ABSTRACT

An optoelectronic module is provided which comprises a first semiconductor body (2) with a radiation exit side (2a) on which an electrical connection region (21, 22) is arranged. The first semiconductor body (2) is arranged with its side opposite the radiation exit side (2a) on a carrier (1). An insulation material (3) is arranged on the carrier (1) laterally next to the first semiconductor body (2), which material forms a fillet and adjoins the semiconductor body (2) form-fittingly. An insulation layer (4) is arranged at least in places on the first semiconductor body (2) and the insulation material (3), on which layer a planar conductive structure is arranged for planar contacting of the first semiconductor body (2), which conductive structure is electrically conductively connected with the electrical connection region (21, 22). A method of producing such an optoelectronic module is furthermore provided.

10 Claims, 3 Drawing Sheets

(56) References Cited

U.S. PATENT DOCUMENTS

| | | |
|---|---|---|
| 7,859,005 B2 * | 12/2010 | Weidner .......................... 257/99 |
| 2002/0139987 A1 | 10/2002 | Collins, III et al. |
| 2006/0169993 A1 | 8/2006 | Fan et al. |
| 2007/0190290 A1 | 8/2007 | Gunther et al. |

FOREIGN PATENT DOCUMENTS

| | | |
|---|---|---|
| CN | 101523598 | 9/2009 |
| DE | 10 213 464 | 10/2002 |
| DE | 10 353 679 | 6/2005 |
| DE | 10 2007 021009 | 4/2008 |
| DE | 10 2007 043001 | 3/2009 |
| DE | 10 2008 005497 | 7/2009 |
| JP | 06-338634 | 12/1994 |
| JP | 10-107316 | 4/1998 |
| JP | 11-150303 | 6/1999 |
| JP | 2002-359402 | 12/2002 |
| JP | 2005-303295 | 10/2005 |
| JP | 2006-324667 | 11/2006 |
| WO | WO 2005/062389 | 7/2005 |
| WO | WO 2007/025521 | 3/2007 |

* cited by examiner

OPTOELECTRONIC MODULE COMPRISING AT LEAST ONE FIRST SEMICONDUCTOR BODY HAVING A RADIATION OUTLET SIDE AND AN INSULATION LAYER AND METHOD FOR THE PRODUCTION THEREOF

RELATED APPLICATIONS

This is a U.S. national stage of application No. PCT/EP2010/000944, filed on Aug. 6, 2010.

Optoelectronic module comprising at least one first semiconductor body having a radiation exit side and an insulation layer and method for the production thereof.

This patent application claims priority from German patent application 10 2009 039 891.0 filed Sep. 3, 2009, the disclosure content of which is hereby incorporated by reference.

FIELD OF THE INVENTION

The present invention relates to an optoelectronic module comprising at least one first semiconductor body having a radiation exit side, one insulation layer and one planar conductive structure for planar contacting of the semiconductor body. The invention further relates to a method of producing an optoelectronic module.

BACKGROUND OF THE INVENTION

A component with a semiconductor body which is contacted in a planar manner is known for example from document DE 103 53 679 A1. In particular, the component comprises a substrate, an optoelectronic semiconductor body arranged thereon and an insulation layer, the insulation layer being guided over the substrate and the optoelectronic semiconductor body. To contact the optoelectronic semiconductor body, a planar conductive structure in the form of metallisation is guided over the insulation layer to contact points of the semiconductor body and to a conductor track of the substrate.

In conventional planar contacting methods, the insulation layer generally rests closely against sides of the semiconductor body, whereby the insulation layer forms steep flanks at side faces of the semiconductor body, which are difficult to expose during the production process. In addition, voids may arise under the insulation layer at the side faces of the semiconductor body, which may disadvantageously impair the reliability of the component.

SUMMARY OF THE INVENTION

An object of the present invention is to provide an improved optoelectronic module, which in particular exhibits low structural height while at the same being highly reliable and is additionally distinguished by a simplified production method.

According to one aspect of the invention, an optoelectronic module is provided, which comprises at least one first semiconductor body with a radiation exit side. At least one electrical connection region is arranged on the radiation exit side, the first semiconductor body being arranged with its side opposite the radiation exit side on a carrier. An insulation material is arranged on the carrier laterally next to the first semiconductor body, which material forms a fillet and adjoins the semiconductor body form-fittingly. An insulation layer is arranged at least in places on the first semiconductor body and the insulation material, at least one planar conductive structure being arranged on the insulation layer for planar contacting of the first semiconductor body, which conductive structure is connected electrically conductively to the electrical connection region of the first semiconductor body.

The planar contacting of the semiconductor body advantageously gives the module a particularly small structural height. A compact module may thus advantageously be provided, which enables the conductive structures to be arranged close to the semiconductor body.

The insulation material, which is arranged against side faces of the semiconductor body and adjoins them directly, advantageously prevents voids from arising between insulation layer and carrier, so advantageously increasing the reliability of the module.

In addition, the insulation material may prevent steep insulation layer flanks in particular at side faces of the semiconductor body. Steep insulation layer flanks for example make the exposure process during production of the module more difficult, whereby the reliability of the module may be disadvantageously impaired. The insulation material, which is arranged in particular to the side of the semiconductor body between insulation layer and carrier, such that no steep insulation layer flanks arise, simplifies production and enables high module reliability.

The insulation material forms a fillet in particular laterally next to the first semiconductor body. The insulation material is in particular arranged form-fittingly in the manner of a fillet against the semiconductor body, whereby voids between insulation material and carrier may be prevented in the region laterally next to the first semiconductor body. The insulation layer is preferably arranged directly on the insulation material, such that no voids are formed between insulation material and insulation layer. In this way, the reliability of the module may be advantageously improved.

The optoelectronic module accordingly comprises two separate insulating components, which at least partially surround the first semiconductor body. The insulation material is arranged in particular laterally next to the first semiconductor body. The insulation layer is arranged on the insulation material and preferably directly on the semiconductor body.

Critical side faces of the semiconductor body may in this way in particular be electrically insulated. "Crosstalk" may preferably be prevented by the insulating two-component configuration, i.e. by the insulation layer and by the insulation material.

With a module according to an embodiment of the invention, the risk of voids and/or cavities arising in the module is significantly reduced. In addition, the following advantages are achieved:
- saving of processing time and thus processing costs on the basis of a simplified insulation layer exposure process,
- higher yield due to smoothed topography and better exposure quality, since the insulation material prevents spaces between the semiconductor bodies and to the side of the semiconductor bodies,
- prevention of reliability problems caused by sharp contours and/or topographies,
- 3D structurability of the flank regions of the semiconductor body,
- high level of insulation of the semiconductor body even in the side region of the semiconductor body,
- protection against for example environmental influences ("harsh environment").

The semiconductor body is preferably a semiconductor chip, particularly preferably a light-emitting diode (LED) or a laser diode. The semiconductor body is particularly preferably a thin-film semiconductor body. A thin-film semiconductor body is in particular a semiconductor body from which the growth substrate was detached during production thereof.

The semiconductor body preferably comprises a radiation-emitting active layer. The active layer preferably comprises a pn-junction, a double heterostructure, a single quantum well (SQW) or a multi quantum well structure (MQW) for radiation generation. The semiconductor body is preferably based on a nitride, phosphide or arsenide compound semiconductor.

In a preferred configuration of the module, at least one second semiconductor body is arranged on the carrier next to the first semiconductor body. The insulation material adjoins the semiconductor bodies in form-fitting manner in regions between the semiconductor bodies. The insulation material adjoining the outer sides of the first semiconductor body and the second semiconductor body in each case forms a fillet and adjoins the semiconductor bodies form-fittingly.

The module may accordingly be produced using both "single chip technology" or "multichip-array technology". The two-component insulation produced by means of the insulation material and the insulation layer may in particular compensate different thicknesses of different semiconductor bodies and different spacings between the semiconductor bodies. For example, a plurality of semiconductor bodies may be arranged on the carrier, which semiconductor bodies differ in the wavelength of the radiation emitted by the semiconductor bodies, and thus emit different colours. In this way, the module may be populated with different semiconductor bodies depending on the respective use. A flexible module, which is adapted in particular to the respective application, is advantageously possible.

In a further preferred configuration of the optoelectronic module, a plurality of further semiconductor bodies are arranged between the first semiconductor body and the second semiconductor body, the insulation material in each case adjoining the semiconductor bodies in form-fitting manner in regions between adjacent semiconductor bodies.

In this way, voids and cavities may advantageously be avoided in the module, so advantageously increasing the reliability of the module. The two-component structure of the insulation of the semiconductor bodies means that semiconductor bodies may in particular advantageously and without difficulty combine different thicknesses, sizes and/or spacings, without at the same time impairing the reliability of the module, complex process optimisation steps advantageously not being necessary, processing time and thus processing costs thereby being minimised.

In a further preferred configuration of the optoelectronic module, the insulation material and/or the insulation layer is transparent to the radiation emitted by the semiconductor body or the radiation emitted by the respective semiconductor bodies. The radiation emitted by the semiconductor body or the semiconductor bodies may in this way be coupled out by the insulation layer and the insulation material without suffering any significant optical losses.

In a further preferred configuration of the optoelectronic module, the insulation material and/or the insulation layer contains a conversion material. The conversion material in the insulation layer and/or the insulation material preferably at least partially absorbs radiation which is emitted by the semiconductor body or bodies, and re-emits secondary radiation in another wavelength range. In this way, the module emits mixed radiation, which contains the radiation emitted by the semiconductor body or the semiconductor bodies and the secondary radiation of the conversion material. A module may for example preferably be produced in this way which emits mixed radiation in the white colour location.

Alternatively, a conversion material, for example in the form of a plate, may be arranged on the semiconductor body or on the semiconductor bodies in particular in each case on the radiation exit side. Such a conversion plate may for example be adhesively bonded in each case to the radiation exit side of the respective semiconductor body or be applied by means of a screen printing process.

The radiation exit side of the semiconductor bodies may in this case be free of insulation material and of the insulation layer. If the insulation layer is transparent, the radiation exit side may alternatively be covered with the insulation layer.

In a preferred configuration of the module, the insulation material is UV-resistant. Preferably, the insulation material contains a polymer material. Particularly preferably the insulation layer also contains a polymer material. The insulation material may for example contain silicone and the insulation layer may be a silicone film, also referred to as silicone foil.

In a particularly preferred configuration of the module, the insulation layer is a multifunctional film, which enhances at least one further functionality, selected from protection against environmental influences, UV protection, protection from water absorption, degradation protection, protection from the effects of temperature and/or protection from cracking. A multifunctional film is also known to a person skilled in the art as "hybrid film" or "multilayer".

In this way, a plurality of requirements of the module may advantageously be met. The insulation layer is in this case in particular not only provided to insulate the semiconductor body(ies), but rather further fulfils for example a protective function for the semiconductor bodies on the carrier.

For planar contacting of the first semiconductor body or the plurality of semiconductor bodies, at least one planar conductive structure is arranged on the insulation layer. The planar conductive structures or the planar conductive structure take the form for example of metal structures. Planar conductive structures, in particular the planar contacting of semiconductor bodies, are known to a person skilled in the art for example from document DE 103 53 679 A1 and are therefore not discussed in greater detail at this point.

If a plurality of semiconductor bodies are arranged on the carrier, these may in each case be electrically conductively connected together by a planar conductive structure. In this case too, the planar conductive structures are preferably arranged on the insulation layer and are thus electrically insulated from the semiconductor bodies in each case by means of the insulation layer.

The planar conductive structures are in particular electrically conductively connected with in each case electrical connection regions of the semiconductor bodies. To this end, in regions of the electrical connection regions of the semiconductor bodies the insulation layer in each case comprises an opening, through which the planar conductive structure is guided in each case.

A method according to an embodiment of the invention for producing an optoelectronic module comprises in particular the following steps:
a) arranging a first semiconductor body with a side remote from a radiation exit side on a carrier,
b) applying an insulation material laterally next to the first semiconductor body on the carrier such that the insulation material takes the form of a fillet and is formed form-fittingly against the semiconductor body,
c) subsequently applying an insulation layer in places on the semiconductor body and the insulation material,
d) subsequently applying at least one planar conductive structure onto the insulation layer for electrical contacting of the first semiconductor body.

Prior to application of the insulation layer on the semiconductor body, the insulation material is accordingly applied laterally next to the semiconductor body on the carrier. The insulation material is in this case applied such that the insulation material forms a fillet and form-fittingly adjoins the semiconductor body. The insulation layer is then applied to the insulation material. The insulation material accordingly forms a ramp for the insulation layer. As a result of the electrical insulation of the semiconductor bodies by means of the two components, in particular of the insulation material and the insulation layer, voids and steep flanks may advantageously be prevented, so advantageously increasing the reliability of the module.

In particular, the insulation material is a separate component of the module. The insulation material is preferably applied in a separate method step from the insulation layer application process.

For electrical insulation of the semiconductor bodies on the carrier, a two-stage process takes place in particular. In the first step, the insulation material is applied, for example by a screen printing method or a stencil printing method. In the second step, the insulation layer is applied, for example by means of a laminating process, a stencil or screen printing process, a dispensing or a jetting process.

In a preferred configuration of the method, in method step a) at least one second semiconductor body is arranged next to the first semiconductor body on the carrier, wherein in method step b) the insulation material is formed in regions between the semiconductor bodies in form-fitting manner against the semiconductor bodies and the insulation material adjoining outer sides of the first semiconductor body and of the second semiconductor body is formed as a fillet and form-fittingly against the semiconductor bodies.

Preferably, in method step a) a plurality of further semiconductor bodies is arranged between the first semiconductor body and the second semiconductor body, wherein the insulation material is formed in each case in regions between adjacent semiconductor bodies form-fittingly against the semiconductor bodies.

With the two-stage process for insulating the semiconductor bodies, it is advantageously possible to combine semiconductor bodies of different thicknesses, sizes and spacings without difficulty on one carrier to form a module, without complex process optimisation being necessary. In particular, the risk of voids or cavities arising may be significantly reduced.

After application of the insulation layer on the semiconductor body(ies) and the insulation material, at least one planar conductive structure or planar conductive structures are applied for example in the form of metal structures.

DETAILED DESCRIPTION OF THE DRAWINGS

Figure 1:
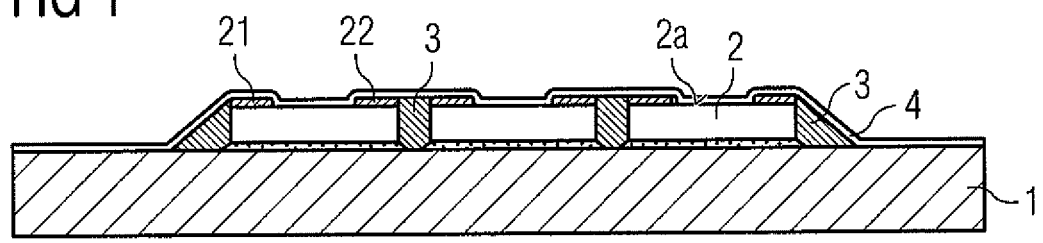
FIG. 1 is a schematic cross-section of an exemplary embodiment of a module according to the invention.

Identical or equivalently acting components are in each case denoted with identical reference numerals. The components illustrated and the size ratios of the components to one another should not be regarded as to scale.

FIG. 1 shows an optoelectronic module, which comprises a carrier 1 and a plurality of semiconductor bodies 2 arranged thereon. The semiconductor bodies 2 each comprise a radiation-emitting active layer for producing electromagnetic radiation. For example the semiconductor bodies 2 are in each case a semiconductor chip, preferably a light-emitting diode (LED) or a laser diode.

The semiconductor bodies 2 each comprise a contact surface on the side facing the carrier 1. In particular the semiconductor bodies 2 are electrically conductively contacted via the contact surface in each case with conductor tracks, which are arranged for example on the carrier 1, or with the carrier 1, which in this case comprises an electrically conductive material.

On the side of the semiconductor bodies 2 remote from the carrier 1, there is in each case arranged a radiation exit side 2a. The radiation exit side 2a preferably outcouples a major part of the radiation emitted by the active layer out of the respective semiconductor body 2.

Electrical connection regions 21, 22 are arranged on the radiation exit side 2a of each of the semiconductor bodies 2. In particular, the electrical connection regions 21, 22 are each arranged in a lateral region of the radiation exit side 2a, such that the electrical connection regions 21, 22 do not necessarily have to be transparent to the radiation emitted by the semiconductor bodies 2.

The electrical connection regions 21, 22 may preferably be connected together on the radiation exit side 2a. For example, the electrical connection regions 21, 22 are arranged on the radiation exit side 2a in the manner of frames, for example in a rectangular shape, such that when the semiconductor bodies are in operation 2 current spreading arises.

An insulation material 3 is arranged in each case laterally next to the individual semiconductor bodies 2. In particular, the insulation material 3 is arranged between adjacent semiconductor bodies 2 such that the insulation material 3 adjoins the individual semiconductor bodies 2 form-fittingly in these regions. The insulation material 3 adjoining outer sides of the outer semiconductor bodies 2 forms a fillet and is likewise arranged form-fittingly against the outer semiconductor bodies 2. In particular, the insulation material 3 preferably forms a ramp in these outer regions.

The regions between the individual semiconductor bodies 2 are thus planarised by means of the insulation material 3. In particular, the height of the insulation material 3 in regions between the semiconductor bodies 2 corresponds to the height of the respective semiconductor bodies 2. Likewise, the maximum height of the insulation material 3 in the form of a fillet against the outer sides of the semiconductor bodies 2 preferably corresponds to the height of the respective semiconductor bodies 2.

An insulation layer 4 is arranged on the semiconductor bodies 2, in particular on the radiation exit side 2a, and on the insulation material 3. The insulation layer 4 is arranged in particular also on the carrier 1 in regions surrounding the respective semiconductor bodies 2 or the insulation material 3.

In the exemplary embodiment of FIG. 1 the module according to the invention comprises a plurality of semiconductor bodies 2. Alternatively the module may merely comprise one semiconductor body 2, which is arranged on the carrier 1. In this case the insulation material 3 is configured as a fillet against all the side faces of the semiconductor body 2, the insulation layer 4 being guided over the fillet-shaped insulation material 3.

The insulation layer 4 is preferably transparent, or at least partially transparent, to the radiation emitted by the semiconductor bodies 2, such that the radiation emitted by the semiconductor bodies 2 may be coupled out of the module on the radiation exit side 2a.

Alternatively, the insulation material 3 and/or the insulation layer 4 may contain a conversion material. The conversion material absorbs at least part of the radiation emitted by the respective semiconductor body 2 and reemits secondary radiation, which preferably exhibits a wavelength range different from the wavelength ranges of the radiation emitted by the semiconductor bodies 2. This advantageously makes possible a module which comprises mixed radiation comprising the radiation emitted by the individual semiconductor bodies 2 and the secondary radiation. A module may for instance be achieved which emits white light.

The insulation material 3 is preferably UV-resistant. Particularly preferably, the insulation material 3 and/or the insulation layer 4 contains a polymer material.

The insulation layer 4 is preferably a multifunctional film and provides at least one further functionality, selected from protection against environmental influences, UV protection, protection from water absorption, degradation protection, protection from the effects of temperature and/or protection from cracking.

In the exemplary embodiment of FIG. 1 the insulation layer 4 completely covers the radiation exit sides 2a of the semiconductor bodies 2 apart from the electrical connection regions 21, 22. Alternatively, however, the radiation exit side 2a may in each case be free of the insulation layer 4 at least in the radiation exit region. If the radiation exit side 2a is exposed, a conversion material, for example a conversion plate, may for example be arranged on the radiation exit side 2a. Alternatively, the conversion material may for example be applied to the exposed radiation exit side 2a of the semiconductor bodies 2 by screen printing.

On the insulation layer 4 at least one planar conductive structure is arranged for planar contacting of the semiconductor bodies 2, which conductive structure is connected electrically conductively with the electrical connection regions 21, 22 of the semiconductor bodies 2 (not shown). The semiconductor bodies 2 are thus preferably electrically conductively contacted via the planar conductive structure by means of the contact surface on the side facing the carrier 1 of the respective semiconductor bodies 2 and by means of the electrical connection regions 21, 22.

Electrical insulation of the individual semiconductor bodies 2 proceeds in the exemplary embodiment of FIG. 1 in a two-component structure, in particular by means of the insulation material 2 and the insulation layer 4, whereby conventionally occurring disadvantages may advantageously be avoided.

Figure 4A:
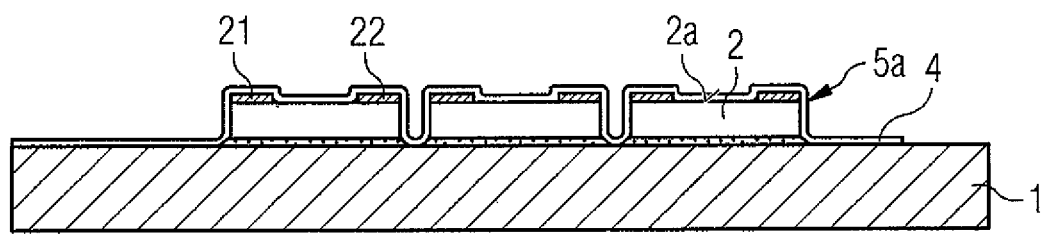
FIGS. 4A and 4B are in each case schematic cross-sections of exemplary embodiments of modules according to the prior art.
Figure 4B:
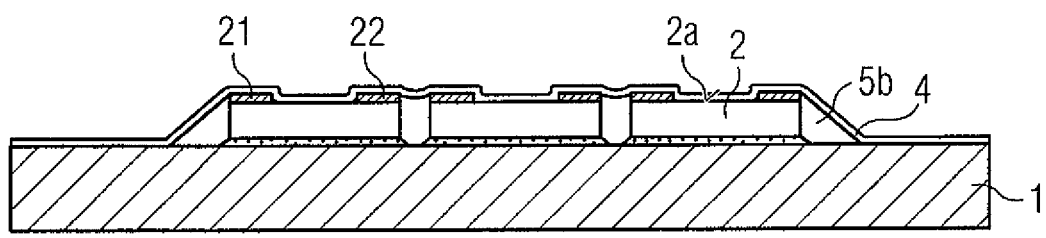

Such conventionally occurring disadvantages are illustrated in particular in FIGS. 4A and 4B. Unlike in the example illustrated in FIG. 1, in FIGS. 4A and 4B no insulation material is arranged between the semiconductor bodies and against the side regions of the semiconductor bodies 2.

In particular, as shown in FIG. 4A, the insulation layer 4 rests close against the side faces of the semiconductor bodies 2. This results in steep insulation layer 4 flanks 5a in the side regions of the semiconductor bodies 2. These steep flanks 5a lead in particular to exposure problems during the subsequent photo method, which is conventionally used in the production process. The reliability of the module may be disadvantageously impaired thereby.

FIG. 4B shows a further conventional module. In this case voids 5b are formed between insulation layer 4 and carrier 1. These voids, which may arise between insulation layer 4 and carrier 1, may however disadvantageously impair the reliability of the module.

As a result of the two component structure of the electrical insulation according to the invention, such disadvantages, which may impair the reliability of the module, may advantageously be avoided.

Figure 2A:
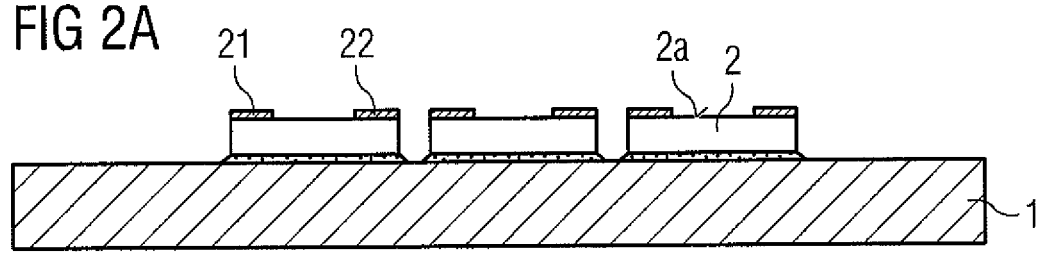
FIGS. 2 and 3 are in each case schematic cross-sections of exemplary embodiments of a module according to the invention in the process of being produced.
Figure 2B:
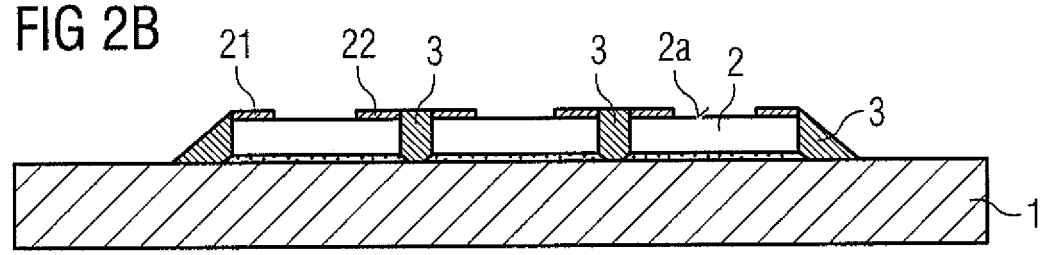
Figure 2C:
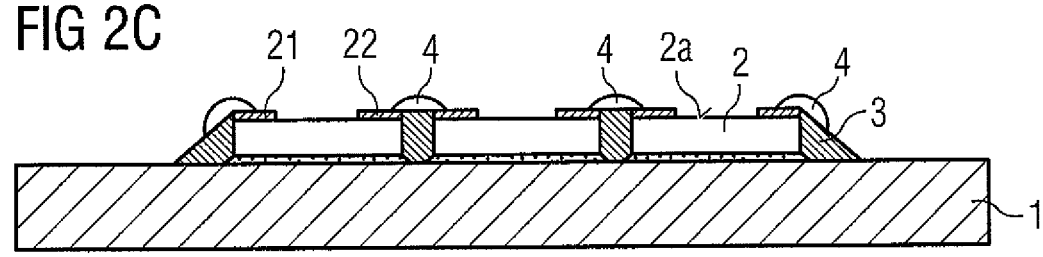
Figure 3A:
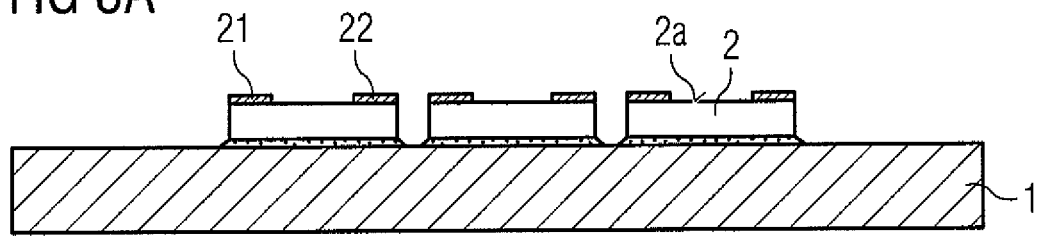

FIGS. 2A to 2C and 3A to 3C each show modules during the production process. In FIGS. 2A and 3A semiconductor bodies 2 are in each case arranged with their side remote from a radiation exit side 2a on a carrier 1. For example, the semiconductor bodies 2 are mounted on the carrier 1 by means of an adhesive layer or of a solder.

Figure 3B:
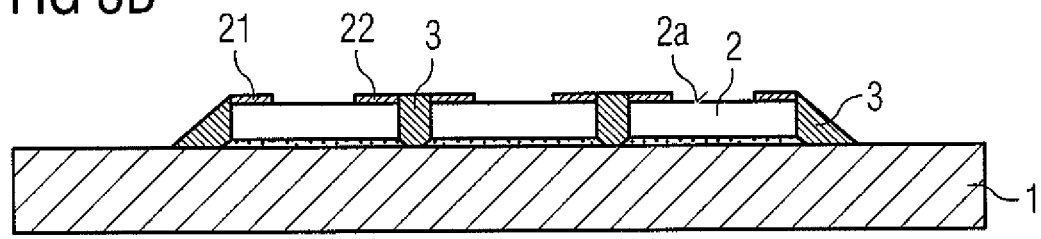

Then, as shown in FIGS. 2B and 3B, an insulation material 3 is arranged laterally next to the semiconductor bodies on the carrier 1. In particular, the insulation material 3 is in each case arranged between adjacent semiconductor bodies, such that the insulation material 3 form-fittingly adjoins the semiconductor bodies 2. The insulation material 3 accordingly fills regions between the semiconductor bodies 2.

Against outer sides of the outer semiconductor bodies 2 the insulation material is arranged such that it forms a fillet. Moreover, in these regions too the insulation material 3 is configured form-fittingly against the semiconductor bodies 2. In these regions the insulation material 3 forms a ramp, for example. Voids in regions between semiconductor bodies, carrier and insulation material 3 are advantageously prevented.

Figure 3C:
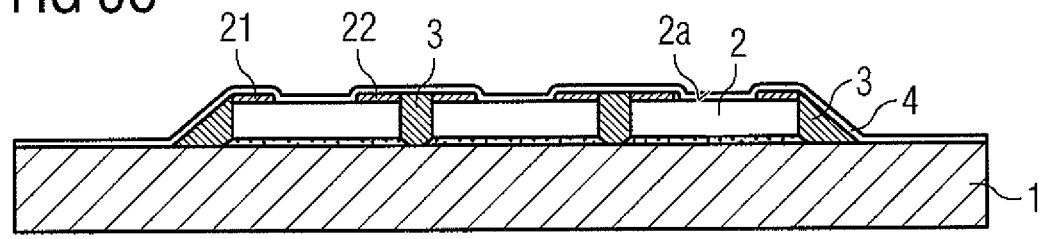

Then, as shown in FIGS. 2C and 3C, an insulation layer 4 is arranged at least in places on the semiconductor bodies 2 and on the insulation material 3. In the exemplary embodiment of FIG. 2C the insulation material 4 is arranged only in places on the radiation exit side 2a, such that the radiation exit side is free of the insulation layer 4 at least at the radiation exit. The radiation exit side 2a of the semiconductor bodies 2 may thus, for example, in each case comprise a subsequently applied conversion material, for example a conversion plate.

Unlike in the exemplary embodiment illustrated in FIG. 2C, the insulation layer 4 in the exemplary embodiment shown in FIG. 3C is arranged all over the radiation exit side 2a of the semiconductor bodies 2. In the exemplary embodiment of FIG. 3C the insulation layer 4 is in particular in one piece, and completely covers the semiconductor bodies 2 and the insulation material 3 and the carrier 1. In this case the insulation layer 4 is transparent to the radiation emitted by the semiconductor bodies 2 or comprises a conversion material arranged in the insulation layer 4.

As explained in FIGS. 2 and 3, in the process of producing such a module a two-stage process is in particular used to insulate the semiconductor bodies 2. In the first step the insulation material 3 is applied to the carrier 1. Then the insulation layer 4 is applied to the semiconductor bodies 2 and the insulation material 3.

The insulation material 3 is for example applied to the carrier 1 by a screen printing or stencil printing method. The insulation layer 4 is preferably a film and is laminated on. Alternatively, the insulation layer 4 may be applied to the semiconductor bodies 2, the insulation material 3 and the carrier 1 by means of a screen printing or stencil printing method or a dispensing or jetting process.

With the two-stage process for insulating the semiconductor bodies 2, semiconductor bodies of different thicknesses, sizes and spacings may advantageously be combined, without complex process optimisation methods being necessary. The risk of voids or cavities arising between insulation layer 4 and carrier 1 may in particular be reduced significantly.

The invention is not limited to the exemplary embodiments as a result of the description made with reference thereto, but instead the invention encompasses any novel feature and any combination of features, including in particular any combination of features in the claims, even if these features or this combination is not itself explicitly indicated in the claims or exemplary embodiments.

The invention claimed is:

1. An optoelectronic module comprising:
   a carrier;
   at least one first semiconductor body having a radiation exit side, the at least one first semiconductor body being arranged with its side opposite the radiation exit side on the carrier;
   at least one electrical connection region arranged on the at least one first semiconductor body;
   an insulation material arranged on the carrier laterally next to the at least one first semiconductor body, the insulation material forming a ramp and adjoining the at least one semiconductor body in a form-fittingly manner;
   an insulation layer arranged at least in places on the at least one first semiconductor body and the insulation material;
   at least one planar conductive structure arranged on the insulation layer for planar contacting of the at least one first semiconductor body, the at least one planar conductive structure being electrically conductively connected with the at least one electrical connection region of the at least one first semiconductor body; and
   at least one second semiconductor body arranged next to the at least one first semiconductor body on the carrier;
   wherein the insulation material form-fittingly adjoins semiconductor bodies in regions between the semiconductor bodies;
   wherein the insulation material adjoining outer sides of the at least one first semiconductor body and the at least one second semiconductor body in each case forms ramps and form-fittingly adjoins the semiconductor bodies;
   wherein the insulation material forms the ramps for the insulation layer and the insulation layer lies directly on the insulation material;
   wherein a height of the insulation material in regions between the semiconductor bodies is the same to a height of respective semiconductor bodies within an entirety of the regions between the semiconductor bodies; and
   wherein the radiation exit side is completely free of the insulation layer at least in a radiation exit region.

2. The optoelectronic module according to claim 1, further comprising:
   a plurality of further semiconductor bodies arranged between the at least one first semiconductor body and the at least one second semiconductor body;
   wherein the insulation material form-fittingly adjoins each further semiconductor of the plurality of further semiconductor bodies in regions between adjacent semiconductor bodies.

3. The optoelectronic module according to claim 1, wherein the insulation material and the insulation layer contains a conversion material.

4. The optoelectronic module according to claim 1, wherein at least one of the insulation material and the insulation layer is transparent.

5. The optoelectronic module according to claim 1, wherein the insulation material is UV-resistant.

6. The optoelectronic module according to claim 1, wherein at least one of the insulation material and the insulation layer contains a polymer material.

7. The optoelectronic module according to claim 1, wherein the insulation layer is a multifunctional film and provides at least one further functionality, selected from at least one of protection against environmental influences, UV protection, protection from water absorption, degradation protection, protection from temperature effects and protection from cracking.

8. An optoelectronic module comprising:
   a carrier;
   at least one first semiconductor body having a radiation exit side, the at least one first semiconductor body being arranged with its side opposite the radiation exit side on the carrier;
   at least one electrical connection region arranged on the at least one first semiconductor body;
   an insulation material arranged on the carrier laterally next to the at least one first semiconductor body, the insulation material forming a ramp and adjoining the at least one semiconductor body in a form-fittingly manner;
   an insulation layer arranged at least in places on the at least one first semiconductor body and the insulation material;
   at least one planar conductive structure arranged on the insulation layer for planar contacting of the at least one first semiconductor body, the at least one planar conductive structure being electrically conductively connected with the at least one electrical connection region of the at least one first semiconductor body;
   at least one second semiconductor body arranged next to the at least one first semiconductor body on the carrier;
   wherein the insulation material form-fittingly adjoins semiconductor bodies in regions between the semiconductor bodies;
   wherein the insulation material adjoining outer sides of the at least one first semiconductor body and the at least one second semiconductor body in each case forms ramps and form-fittingly adjoins the semiconductor bodies;
   wherein the insulation material forms the ramps for the insulation layer and the insulation layer lies directly on the insulation material; and
   wherein a height of the insulation material in regions between the semiconductor bodies is the same to a height of respective semiconductor bodies within an entirety of the regions between the semiconductor bodies;
   wherein the insulation layer contains a polymer material;
   wherein the ramp formed by the insulation material laterally next to the semiconductor bodies extends continuously from the carrier to radiation exit sides at a constant slope which is different from 0° and from 90°, and the ramp having a triangular shape when seen in cross-section from a plane perpendicular with a top of the carrier, and
   wherein the radiation exit side is completely free of the insulation layer at least in a radiation exit region.

9. The optoelectronic module according to claim 8, wherein the insulation material and the insulation layer contain a conversion material.

10. The optoelectronic module according to claim 8, wherein the slope is about 45°.

* * * * *

UNITED STATES PATENT AND TRADEMARK OFFICE
CERTIFICATE OF CORRECTION

PATENT NO.        : 8,847,247 B2
APPLICATION NO.   : 13/394097
DATED             : September 30, 2014
INVENTOR(S)       : Karl Weidner It is certified that error appears in the above-identified patent and that said Letters Patent is hereby corrected as shown below:

In the Claims

Column 9, claim 2 should read as follows:

2. The optoelectronic module according to claim 1, further comprising:
a plurality of further semiconductor bodies arranged between the at least one first semiconductor body and the at least one second semiconductor body;
wherein the insulation material form-fittingly adjoins each further semiconductor body of the plurality of further semiconductor bodies in regions between adjacent semiconductor bodies.

Signed and Sealed this
Tenth Day of March, 2015

Michelle K. Lee
*Deputy Director of the United States Patent and Trademark Office*